United States Patent
Seyama et al.

(10) Patent No.: US 11,393,700 B2
(45) Date of Patent: Jul. 19, 2022

(54) BONDING APPARATUS AND BONDING METHOD

(71) Applicant: Yamaha Motor Robotics Holdings Co., Ltd., Tokyo (JP)

(72) Inventors: Kohei Seyama, Tokyo (JP); Yuichiro Noguchi, Tokyo (JP)

(73) Assignee: Yamaha Motor Robotics Holdings Co., Ltd., Tokyo (JP)

(*) Notice: Subject to any disclaimer, the term of this patent is extended or adjusted under 35 U.S.C. 154(b) by 248 days.

(21) Appl. No.: 16/632,879

(22) PCT Filed: Jul. 12, 2018

(86) PCT No.: PCT/JP2018/026389
§ 371 (c)(1),
(2) Date: Mar. 20, 2020

(87) PCT Pub. No.: WO2019/013300
PCT Pub. Date: Jan. 17, 2019

(65) Prior Publication Data
US 2020/0388507 A1 Dec. 10, 2020

(30) Foreign Application Priority Data
Jul. 12, 2017 (JP) .............................. JP2017-136296

(51) Int. Cl.
*H01L 21/00* (2006.01)
*H01L 21/50* (2006.01)
(Continued)

(52) U.S. Cl.
CPC .............. *H01L 21/50* (2013.01); *B23K 3/00* (2013.01); *H01L 24/75* (2013.01); *H01L 2021/60195* (2013.01); *H01L 2224/83203* (2013.01)

(58) Field of Classification Search
CPC ................. H01L 21/50; H01L 24/75; H01L 2021/60195; H01L 2224/83203;
(Continued)

(56) References Cited

U.S. PATENT DOCUMENTS 4,798,646 A * 1/1989 Sumi ...................... B26D 3/281
156/364
5,009,735 A * 4/1991 Ametani ............. B29C 63/0013
156/241
(Continued)

FOREIGN PATENT DOCUMENTS

JP  H0661307    3/1994
JP  2994356 B1 * 12/1999  ......... H01L 21/6836
(Continued)

OTHER PUBLICATIONS

"International Search Report (Form PCT/ISA/210) of PCT/JP2018/026389," dated Sep. 11, 2018, with English translation thereof, pp. 1-4.
(Continued)

*Primary Examiner* — Kiley S Stoner
(74) *Attorney, Agent, or Firm* — JCIPRNET

(57) ABSTRACT

This bonding apparatus is provided with: a bonding mechanism which has a bonding surface that holds a semiconductor die in a detachable manner, with a film being interposed therebetween, and a heater that applies heat to the bonding surface; a film conveyance mechanism which supplies the film to the bonding surface; a remover bar which is able to enter between the film and the bonding surface; and a drive unit which drives the remover bar.

7 Claims, 8 Drawing Sheets

(51) Int. Cl.
*H01L 23/00* (2006.01)
*B23K 3/00* (2006.01)
*H01L 21/60* (2006.01)

(58) Field of Classification Search
CPC ......... H01L 24/32; H01L 24/83; H01L 24/92;
H01L 24/05; H01L 24/13; H01L 24/16;
H01L 24/29; H01L 24/81; H01L
2224/0401; H01L 2224/05624; H01L
2224/05647; H01L 2224/13144; H01L
2224/16225; H01L 2224/16227; H01L
2224/2919; H01L 2224/29294; H01L
2224/2939; H01L 2224/32013; H01L
2224/32058; H01L 2224/32105; H01L
2224/32106; H01L 2224/32225; H01L
2224/73204; H01L 2224/75252; H01L
2224/75314; H01L 2224/75701; H01L
2224/75704; H01L 2224/75745; H01L
2224/75753; H01L 2224/75901; H01L
2224/81001; H01L 2224/81191; H01L
2224/81203; H01L 2224/81903; H01L
2224/83001; H01L 2224/83104; H01L
2224/83192; H01L 2224/83862; H01L
2224/9211; H01L 2924/10253; H01L
21/563
See application file for complete search history.

(56) References Cited

U.S. PATENT DOCUMENTS

| | | | | |
|---|---|---|---|---|
| 5,403,412 A * | 4/1995 | Hidaka | ............. | H01L 21/67132 156/64 |
| 5,437,960 A * | 8/1995 | Nagate | ................... | B32B 38/10 156/234 |
| 2001/0016384 A1 * | 8/2001 | Takeda | ................... | H01L 24/29 438/249 |
| 2003/0062116 A1 * | 4/2003 | Lee | ........................ | B29C 63/02 156/249 |
| 2003/0089692 A1 * | 5/2003 | Lee | ..................... | B23K 26/146 219/121.69 |
| 2003/0092288 A1 * | 5/2003 | Yamamoto | ........ | H01L 21/67092 438/800 |
| 2005/0205204 A1 * | 9/2005 | Kurosawa | ......... | H01L 21/67132 156/716 |
| 2006/0011284 A1 * | 1/2006 | Ametani | ........... | H01L 21/67132 156/64 |
| 2007/0187036 A1 * | 8/2007 | Ametani | ........... | H01L 21/67132 156/716 |
| 2007/0235131 A1 * | 10/2007 | Tsujimoto | ........... | B29C 63/0013 156/714 |
| 2009/0014124 A1 * | 1/2009 | Tsujimoto | ......... | H01L 21/67132 156/714 |
| 2009/0107634 A1 * | 4/2009 | Kanazawa | ........ | H01L 21/67132 156/714 |
| 2010/0181019 A1 * | 7/2010 | Kino | ................. | H01L 21/67132 156/247 |
| 2011/0036477 A1 * | 2/2011 | Kato | .................. | B65H 35/0013 156/64 |
| 2011/0162790 A1 * | 7/2011 | Kobayashi | ........ | H01L 21/67132 156/247 |
| 2011/0220296 A1 * | 9/2011 | Kuga | ....................... | B65H 3/32 156/765 |
| 2014/0069989 A1 | 3/2014 | Masumoto | | |
| 2015/0367622 A1 * | 12/2015 | Adachi | ................... | B32B 39/00 156/759 |
| 2016/0347047 A1 * | 12/2016 | Eguchi | ................. | B32B 43/006 |
| 2018/0350641 A1 * | 12/2018 | Nakamura | .......... | H01L 21/6836 |
| 2019/0206734 A1 * | 7/2019 | Sekiya | ................ | H01L 21/6836 |
| 2020/0227292 A1 * | 7/2020 | Ito | ..................... | H01L 21/67132 |

FOREIGN PATENT DOCUMENTS

| | | | |
|---|---|---|---|
| JP | 2003007771 | 1/2003 | |
| JP | 2009016523 | 1/2009 | |
| JP | 2010192615 | 9/2010 | |
| JP | 2010232428 A * | 10/2010 | ....... H01L 21/67132 |
| JP | 2012028594 | 2/2012 | |
| JP | 2012044071 | 3/2012 | |
| JP | 2015035493 | 2/2015 | |

OTHER PUBLICATIONS

"Written Opinion of the International Searching Authority (Form PCT/ISA/237) of PCT/JP2018/026389," dated Sep. 11, 2018, with English translation thereof, pp. 1-7.

* cited by examiner

BONDING APPARATUS AND BONDING METHOD

CROSS-REFERENCE TO RELATED APPLICATION

This application is a 371 application of the international PCT application serial no. PCT/JP2018/026389, filed on Jul. 12, 2018, which claims the priority benefits of Japan application no. 2017-136296, filed on Jul. 12, 2017. The entirety of each of the above-mentioned patent applications is hereby incorporated by reference herein and made a part of this specification.

TECHNICAL FIELD

The present disclosure relates to a bonding apparatus and a bonding method.

BACKGROUND ART

A mounting technology for bonding an electronic component such as a semiconductor die onto a substrate is known. For example, Patent Literature 1 discloses a technique for inhibiting an adhesive from adhering to a semiconductor die due to creeping up of the adhesive. In the technique of Patent Literature 1, the semiconductor die is bonded to a substrate via a resin film.

CITATION LIST

Patent Literature

[Patent Literature 1] Japanese Patent Laid-Open No. 2015-35493

SUMMARY OF INVENTION

Technical Problem

However, in the configuration of Patent Literature 1, the film is melted by heat of the heater. As a result, the molten film may stick to a bonding tool. Film sticking causes a device to stop. Accordingly, since productivity of the device is reduced, a maintenance operation is required.

A bonding apparatus and a bonding method of the present disclosure have been made in view of such circumstances. The present disclosure describes a bonding apparatus and a bonding method in which a decrease in productivity of a bonding apparatus using a film for preventing creeping up can be inhibited in the device using.

Solution to Problem

One embodiment of the present disclosure is a bonding apparatus for mounting an electronic component on a substrate or other electronic components, including a bonding unit which has a bonding surface detachably holding the electronic component via a film and a heat source supplying heat to the bonding surface, a film supply unit which supplies the film along the bonding surface, a peeling member which can enter between the film and the bonding surface, and a drive unit which moves the peeling member between the film and the bonding surface to separate the film from the bonding surface.

In the bonding apparatus, a bonding tool holds the electronic component via the film supplied to the bonding surface. Then, the bonding tool provides heat from the heat source to the bonding surface. The bonding tool uses the heat to mount the held electronic component on the substrate or another electronic component. When heat is provided to the electronic component, the heat is transmitted to the electronic component via the bonding surface and the film. As a result, the heat may cause the film to stick to the bonding surface. Therefore, the bonding apparatus drives the peeling member using the drive unit. This drive causes the peeling member to move between the film and the bonding surface. As a result, the peeling member can peel off the film stuck to the bonding surface. Accordingly, the bonding apparatus can eliminate sticking of the film to the bonding surface. Therefore, in the bonding apparatus using the film for preventing creeping up, a decrease in productivity of the device can be inhibited.

Advantageous Effects of Invention

The bonding apparatus and the bonding method of the present disclosure can inhibit a decrease in device productivity in the bonding apparatus using a film for preventing creeping up.

DESCRIPTION OF EMBODIMENTS

<Bonding Apparatus>

Figure 1:
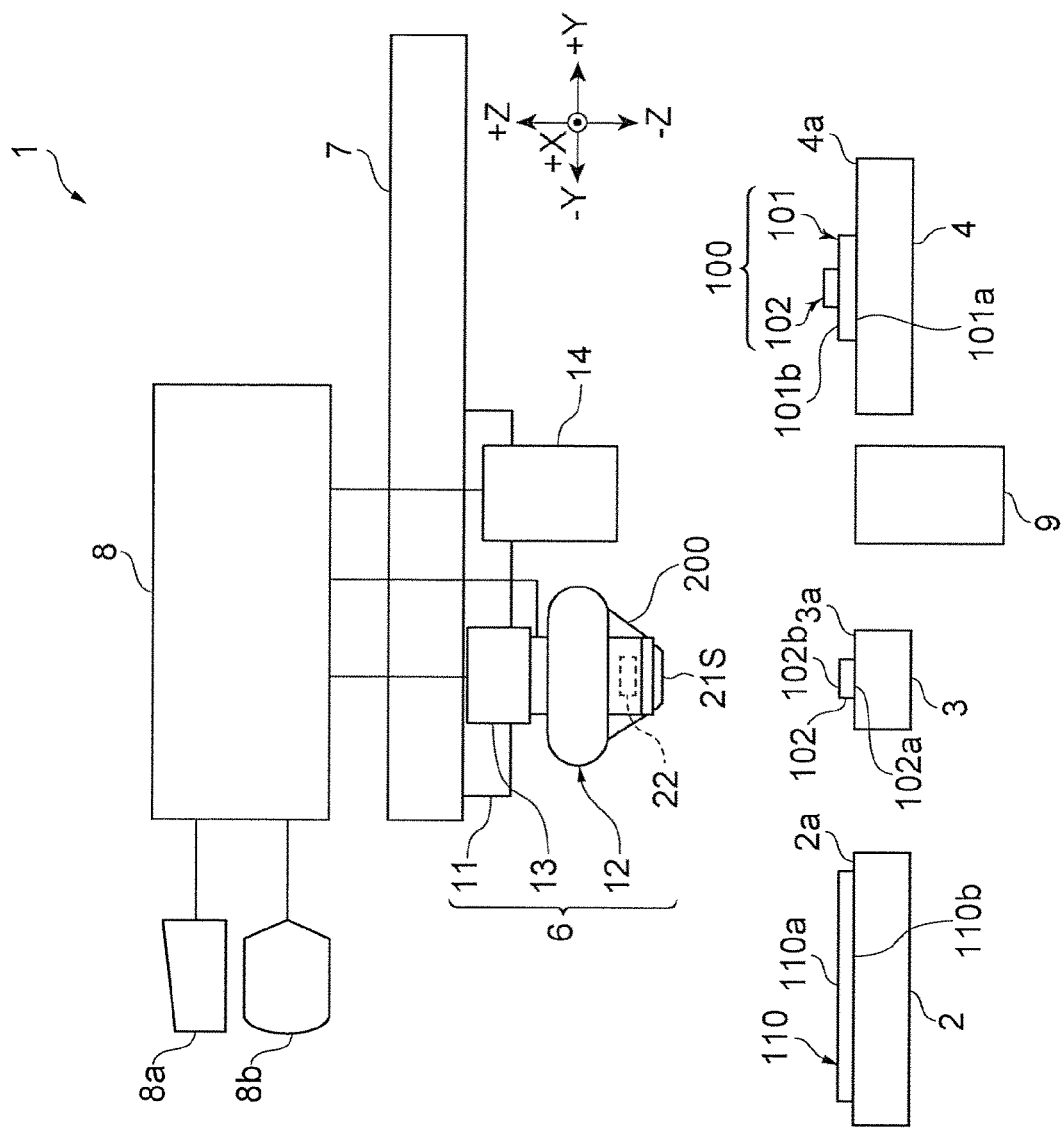
FIG. 1 is a schematic view showing a configuration of a bonding apparatus according to an embodiment.

Hereinafter, embodiments for implementing a bonding apparatus and a bonding method of the present disclosure will be described in detail with reference to the accompanying drawings. In the description of the drawings, the same elements are denoted by the same reference numerals. In addition, repeated descriptions thereof will be omitted.

In the description of the present disclosure, the term "air permeability" indicates an ability of a creeping up prevention sheet, which is interposed between a bonding head and a semiconductor die, to transmit air. In addition, the expression "having air permeability" indicates an ability of the creeping up prevention sheet to transmit air to the extent that the bonding head can hold the semiconductor die on its bonding surface using a vacuum supplied from suction holes formed in the bonding head. Examples of the creeping up prevention sheet having air permeability include a porous sheet, a nonwoven fabric, and a sheet in which air holes are formed. However, aspects of the creeping up prevention sheet are not interpreted as limiting. In the present disclosure, the creeping up prevention sheet will be described as a sheet in which air holes are formed. That is, a sheet which does not have air permeability originally but acquires air permeability after being subjected to a process of forming air holes will be exemplified.

As shown in FIG. 1, the bonding apparatus 1 is for mounting a semiconductor die 102, which is an example of an electronic component, in a bonding region of a substrate 101. As a result of mounting the semiconductor die 102, a semiconductor device 100 including the substrate 101 and the semiconductor die 102 is obtained. In the following description, an X axis and a Y axis orthogonal to each other are directions parallel to a main surface of the semiconductor die 102 (or a main surface of any one of stages). A Z axis is a direction perpendicular to both the X axis and the Y axis.

Figure 2:
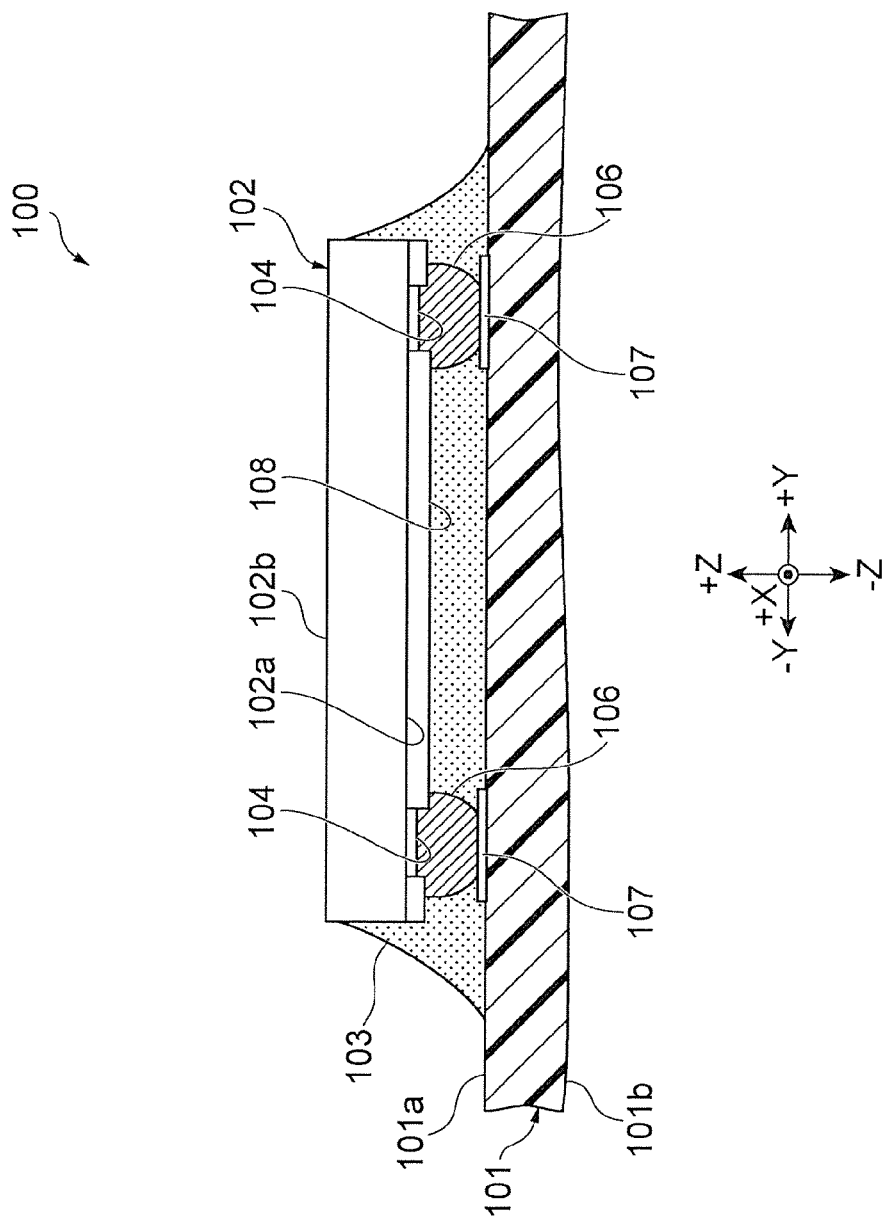
FIG. 2 is a cross-sectional view of a semiconductor device assembled by the bonding apparatus of FIG. 1.

The semiconductor device 100 which is assembled by the bonding apparatus 1 will be described. As shown in FIG. 2, the semiconductor device 100 has the substrate 101 and the semiconductor die 102.

The substrate 101 has an individual plate shape. The substrate 101 has a first main surface 101a and a second main surface 101b. At least one mounting region on which the semiconductor die 102 is mounted is formed on the first main surface 101a. Therefore, the semiconductor die 102 is bonded to the first main surface 101a of the substrate 101. The second main surface 101b is a back surface of the first main surface 101a. A material of the substrate 101 is, for example, an organic material, an inorganic material, or a composite material thereof. The substrate 101 made of an organic material is, for example, an epoxy substrate or a polyimide substrate. The substrate 101 made of an inorganic material is, for example, a glass substrate. The substrate 101 made of a composite material is, for example, a glass epoxy substrate. The substrate 101 is a so-called interposer.

A plurality of mounting regions may be provided on one substrate. In this case, the semiconductor die 102 is bonded in each mounting region of the substrate. Thereafter, the substrate is diced into pieces in each mounting region. As a result, a plurality of semiconductor devices 100 are obtained. Further, the semiconductor device may have a stack structure in which a plurality of semiconductor dies 102 are stacked. In a stacked semiconductor device, all of two or more semiconductor dies 102 may be oriented in the same direction. Also, in the stacked semiconductor device, two or more semiconductor dies 102 may be oriented in different directions. Further, in the semiconductor device, two or more semiconductor dies 102 may be bonded to one mounting region.

The semiconductor die 102 is fixed to the substrate 101 using an adhesive member 103. The adhesive member 103 is, for example, a thermosetting resin.

The semiconductor die 102 has an individual plate shape smaller than the substrate 101 in a plan view. The semiconductor die 102 has a first main surface 102a and a second main surface 102b. A predetermined circuit pattern is provided on the first main surface 102a. Further, a plurality of electrode pads 104, a plurality of bump electrodes 106, and a protective film 108 are provided on the first main surface 102a. The first main surface 102a faces the first main surface 101a of the substrate 101. Such a bonding mode is called face-down bonding. The second main surface 102b is a back surface opposite to the first main surface 102a. The semiconductor die 102 is made of a semiconductor material such as silicon.

The electrode pads 104 are electrically connected to electrode pads 107 formed on the first main surface 101a. The bump electrodes 106 are provided on the electrode pads 104. The protective film 108 is provided around the plurality of bump electrodes 106. In other words, outer peripheral end parts of the electrode pads 104 are covered with the protective film 108. On the other hand, central parts of the electrode pads 104 are exposed from the protective film 108. These exposed parts are parts electrically connected with the bump electrodes 106. Materials of the electrode pads 104 and the bump electrodes 106 are, for example, materials having conductivity. For example, the electrode pads 104 may be made of aluminum or copper. Further, for example, the bump electrodes 106 may be made of gold or the like.

Next, the bonding apparatus 1 will be described. As shown in FIG. 1, the bonding apparatus 1 includes a wafer stage 2, an intermediate stage 3, a bonding stage 4, a bonding unit 6, an XY stage 7, a bonding control unit (hereinafter simply referred to as a "control unit 8"), and an imaging unit 9.

A wafer 110 is temporarily placed on the wafer stage 2. The wafer 110 is fixed to a mounting surface 2a of the wafer stage 2 with an adhesive film. The wafer 110 includes a plurality of diced semiconductor dies 102. The wafer 110 has a first main surface 110a and a second main surface 110b. The first main surface 110a has a predetermined circuit pattern. The first main surface 110a corresponds to the first main surface 102a of the semiconductor die 102. The second main surface 110b is a back surface opposite to the first main surface 110a. The second main surface 110b corresponds to the second main surface 102b of the semiconductor die 102.

The semiconductor die 102 is temporarily placed on the intermediate stage 3. The semiconductor die 102 is fixed to a placement surface 3a of the intermediate stage 3 with an adhesive film. The intermediate stage 3 is disposed between the wafer stage 2 and the bonding stage 4. The intermediate stage 3 can be moved in the X axis direction and the Y axis direction using a drive mechanism such as a linear motor.

In the step of moving the semiconductor die 102 from the wafer stage 2 to the bonding stage 4, the semiconductor die 102 is first picked up from the wafer stage 2. Next, the semiconductor die 102 is turned upside down. That is, initially, the first main surface 102a is on an upper side thereof, and the second main surface 102b is on a lower side thereof. By being turned upside down, the second main surface 102b is on the upper side and becomes the first main surface 102a. In this state, the semiconductor die 102 is mounted on the intermediate stage 3. Therefore, the first main surface 102a of the semiconductor die 102 mounted on the intermediate stage 3 faces the placement surface 3a of the intermediate stage 3.

The substrate 101 being bonded is temporarily placed on the bonding stage 4. The substrate 101 is fixed to a mounting surface 4a of the bonding stage 4 with an adhesive film. At this time, the first main surface 101a of the substrate 101 faces the mounting surface 4a of the bonding stage 4. The bonding stage 4 can move the substrate 101 in the X axis direction using a drive mechanism including a guide rail. The bonding stage 4 has a heater for heating the semiconductor die 102 and the substrate 101.

The bonding unit 6 includes a bonding head 11 (a base), a bonding tool 12, a Z axis drive mechanism 13, and an imaging unit 14. The bonding head 11 is attached to the XY stage 7. The bonding head 11 is movable in the X axis direction and the Y axis direction. The bonding tool 12 is attached to the bonding head 11 via the Z axis drive mechanism 13. The Z axis drive mechanism 13 moves the bonding tool 12 in a positive or negative Z axis direction. Further, the Z axis drive mechanism 13 rotates the bonding tool 12 around the Z axis. The expression "around the Z axis" has the same meaning as around a normal direction of a bonding surface 21S. The imaging unit 14 is also attached to the bonding head 11. When the bonding head 11 is moved by the XY stage 7, the bonding tool 12 and the imaging unit 14 attached to the bonding head 11 are also moved.

The imaging unit 14 is separated from the bonding tool 12 by a predetermined distance in the Y axis direction. The imaging unit 14 images the second main surface 102b of the semiconductor die 102 mounted on the intermediate stage 3. The imaging unit 14 images the second main surface 102b of the semiconductor die 102 mounted on the bonding stage 4. The imaging unit 14 may not be fixed to the bonding head 11. Movement of the imaging unit 14 may be independent of movement of the bonding tool 12.

The bonding tool 12 has the bonding surface 21S. The bonding surface 21S holds the semiconductor die 102. The bonding surface 21S is a lower end surface on the bonding stage 4 side of the bonding tool 12 extending in the Z axis direction. The bonding tool 12 has an air vacuum function and/or an air blow function. With these functions, the bonding tool 12 sucks or releases the semiconductor die 102. In the present disclosure, when the bonding tool 12 holds the semiconductor die 102, the bonding tool 12 and the semiconductor die 102 sandwich a film 200. A configuration of the bonding tool 12 will be described later.

The film 200 has a plurality of pores for providing air permeability between one main surface and the other main surface. A smaller Gurley value of the film 200 is preferable for sucking an electronic component such as the semiconductor die 102. The Gurley value of the film 200 is, for example, 1 or more and 2 or less (s/100 cc/in$^2$).

The film 200 is softer than a semiconductor material of the semiconductor die 102 that is a bonding target. The film 200 is softer than a material forming the bonding surface 21S. Here, the term "soft" indicates that, for example, a rigidity of the film 200 is lower than a rigidity of the semiconductor die 102. The film 200 is, for example, a nonwoven fabric film.

A material of the film 200 is not particularly limited. As an example of the material of the film 200, a tetrafluoroethylene resin (PTFE) or a polyimide may be adopted. For example, when a tetrafluoroethylene resin is used for the film 200, the tetrafluoroethylene resin may be PTFE nanofibers. The PTFE nanofibers may have a pore diameter of about 1 μm or more and 2 μm or less, have a thickness of about 56 μm, and have a Gurley value of 1.2 (s/100 cc/in$^2$). The PTFE nanofibers can reduce a Gurley value with respect to a thickness. In other words, when the PTFE nanofibers are used for the film 200, air permeability is improved.

The control unit 8 controls operations of components of the bonding apparatus 1. Specifically, the control unit 8 is connected to each of the components such as the bonding unit 6, the XY stage 7, and the imaging units 9 and 14 to be able to transmit and receive signals. An operation of each component is controlled by this connection. For example, the control unit 8 is a computer device including a central processing unit (CPU), a memory, and the like. A bonding program for performing processing necessary for bonding is stored in the memory in advance. The control unit 8 is configured to be able to execute each process related to a semiconductor die bonding method according to the present disclosure which will be described later. An operation unit 8a for inputting control information and a display unit 8b for outputting control information are connected to the control unit 8.

The control unit 8 performs position control of the bonding unit 6 (X, Y, and Z axes), position control of the bonding tool 12 (Z axis), position control of the bonding tool 12 around the Z axis (θ), and tilt control of the bonding tool 12. The tilt control is control of a tilt with respect to the Z axis. The control unit 8 performs, for example, on/off control of an air vacuum function, on/off control of an air blow function, load control when the semiconductor die 102 is mounted on the substrate 101, and heat supply control of the bonding stage 4 and the bonding tool 12. The control unit 8 controls operations of a heater 22, a film conveyance mechanism 30, and a film peeling mechanism 40 included in the bonding tool 12, which will be described later.

Figure 3:
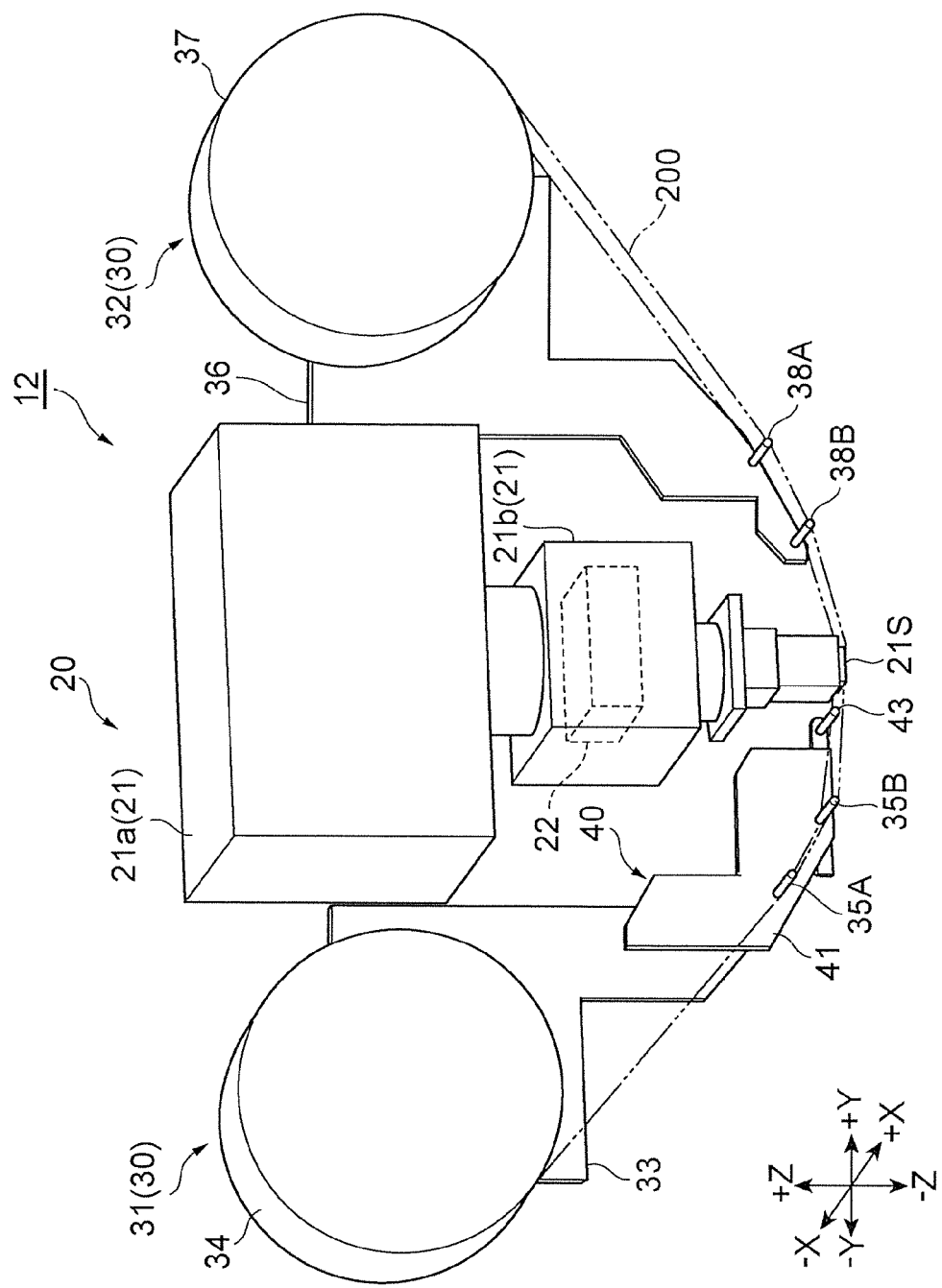
FIG. 3 is an enlarged perspective view showing a bonding tool of the bonding apparatus shown in FIG. 1.

The bonding tool 12 will be described in more detail with reference to FIG. 3. As shown in FIG. 3, the bonding tool 12 includes a bonding mechanism 20 (bonding unit), a film conveyance mechanism 30 (film supply unit), and a film peeling mechanism 40 (film peeling unit).

The bonding mechanism 20 has a body 21 and the heater 22. The heater 22 is a heating unit. The body 21 has a base block 21a, a bonding block 21b, and the bonding surface 21S. An upper end of the square pillar-shaped base block 21a is connected to the Z axis drive mechanism 13. The bonding block 21b is attached to a lower end of the base block 21a. The base block 21a may be cylindrical. The bonding block 21b has the bonding surface 21S. The bonding surface 21S is a lower end surface of the bonding block 21b. The bonding surface 21S detachably holds the semiconductor die 102 via the film 200. Attachment/detachment of the semiconductor die 102 is performed by a plurality of suction holes. Upper ends of the suction holes are connected to a pneumatic system such as a pump. Lower ends of the suction holes form openings in the bonding surface 21S.

The heater 22 is disposed inside the body 21. The heater 22 heats the semiconductor die 102. The heater 22 may heat the substrate 101. The heater 22 switches a heating operation between start and stop. This switching is performed in accordance with control signals received from the control unit 8.

The film conveyance mechanism 30 conveys the film 200 to the bonding surface 21S. The film conveyance mechanism 30 collects the film 200 from the bonding surface 21S. The film conveyance mechanism 30 is disposed above the bonding surface 21S. The film conveyance mechanism 30 has a supply unit 31 and a collection unit 32. The supply unit 31 and the collection unit 32 sandwich the bonding mechanism 20. The film 200 unwound from the supply unit 31 is wound around the collection unit 32 via the bonding surface 21S.

The supply unit 31 includes a supply body 33, a supply reel 34 (one reel), and supply pins 35A and 35B. The supply body 33 is fixed to the base block 21a. The supply body 33 holds relative positions of the supply reel 34 and the supply pins 35A and 35B.

One end of the film 200 is attached to the supply reel 34. The supply reel 34 is provided to be rotatable with respect to the supply body 33. A rotation angle of the supply reel 34 is controlled by a motor. By this angle control, unwinding of the film 200 and control of tension acting on the film 200 are performed. The supply reel 34 constitutes a pair of reels together with a collection reel 37, which will be described later.

The supply pins 35A and 35B are provided below the supply reel 34 and near the bonding mechanism 20. Base ends of the cylindrical supply pins 35A and 35B are fixed to a cover 41 of the film peeling mechanism 40. Tips of the supply pins 35A and 35B extend in the +X axis direction. The supply pins 35A and 35B guide the film 200 unwound from the supply reel 34 to the bonding surface 21S. An outer circumferential lower surface of the supply pin 35B disposed on the bonding mechanism 20 side is positioned slightly above the bonding surface 21S.

The film peeling mechanism 40 is attached to the supply body 33. The film peeling mechanism 40 is disposed in the vicinity of the bonding mechanism 20. Details of the film peeling mechanism 40 will be described later.

The collection unit 32 includes a collection body 36, a collection reel 37 (the other reel), and collection pins 38A and 38B. The collection unit 32 does not have the film peeling mechanism 40. The collection unit 32 has substantially the same configuration as the supply unit 31 except for the film peeling mechanism 40.

The other end part of the film 200 is attached to the collection reel 37. The collection reel 37 is provided to be rotatable with respect to the collection body 36. A rotation angle of the collection reel 37 is controlled by a motor. By this angle control, winding of the film 200 and control of the tension acting on the film 200 are performed.

The collection pins 38A and 38B are provided below the collection reel 37 and near the bonding mechanism 20. Base ends of the cylindrical collection pins 38A and 38B are fixed to the collection body 36. Tips of the collection pins 38A and 38B extend in the +X axis direction. The collection pins 38A and 38B guide the film 200 unwound from the collection reel 37 to the bonding surface 21S.

Figure 4:
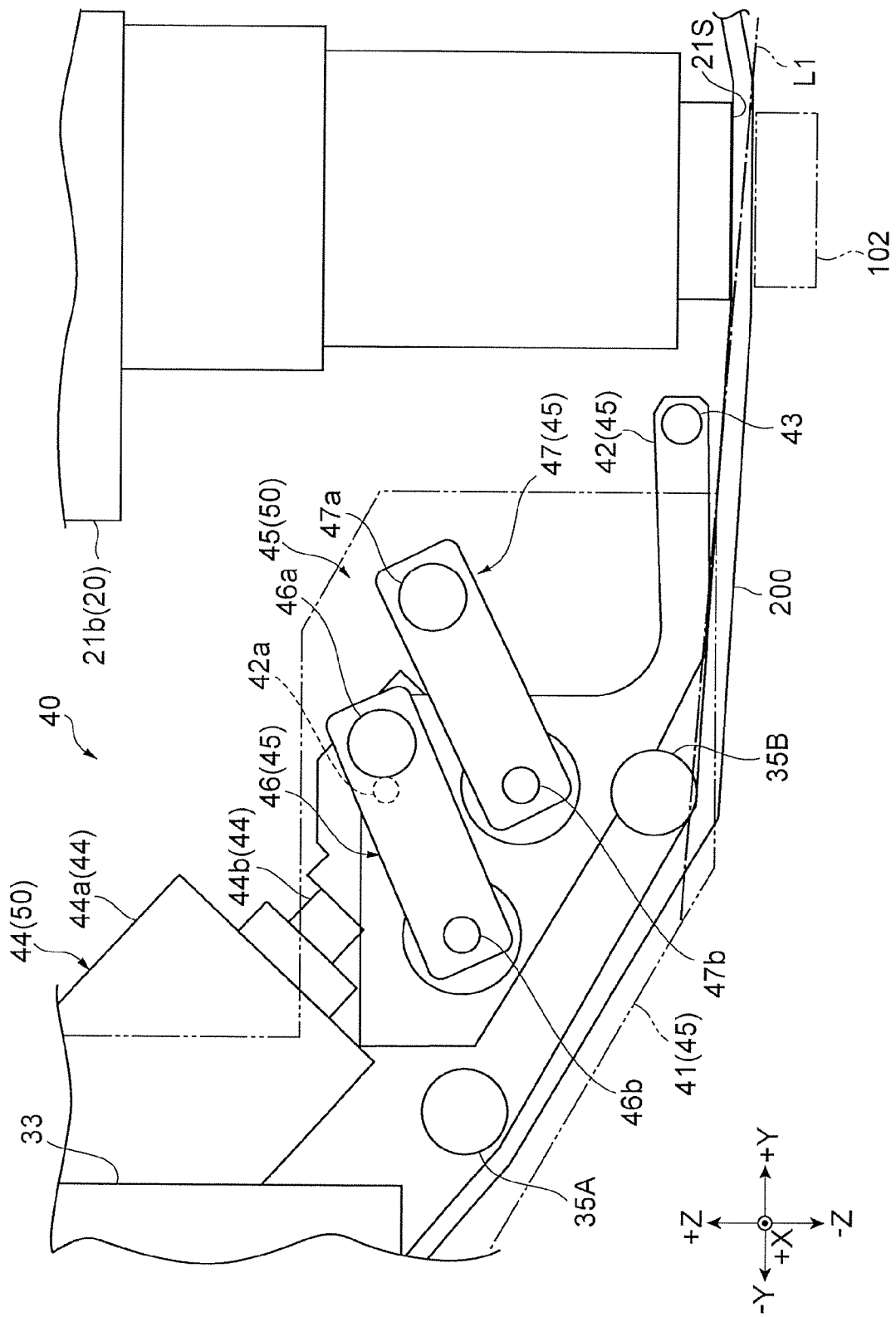
FIG. 4 is a front view showing a film peeling mechanism according to a first mode.

The film peeling mechanism 40 will be described in detail. As shown in FIG. 4, the film peeling mechanism 40 has the cover 41, an arm body 42, a remover bar 43 (a peeling member), an actuator 44, and a link mechanism 45. FIG. 4 shows a structure when the cover 41 is removed to clearly show a configuration of the link mechanism 45. In FIG. 4, the cover 41 is indicated by a two-dotted chain line. In the film peeling mechanism 40, the link mechanism 45 to which a driving force is given by the actuator 44 reciprocates the arm body 42 along a predetermined trajectory. The remover bar 43 is provided at a tip of the arm body 42. By moving the arm body 42 along the predetermined trajectory, the remover bar 43 peels off the film 200 stuck to the bonding surface 21S.

The cover 41 is a plate-shaped member. A base end of the cover 41 is fixed to the supply body 33.

The arm body 42 is a plate-shaped member. A base end of the remover bar 43 is fixed to the tip of the arm body 42 near the bonding mechanism 20. The arm body 42 is a part of the link mechanism 45. A position of the arm body 42 relative to the supply body 33 and the cover 41 can be changed. That is, when the arm body 42 moves, the remover bar 43 moves. Movement of the remover bar 43 follows a predetermined trajectory.

The actuator 44 is a so-called drive source. The actuator 44 is, for example, an air cylinder. The actuator body 44a is rotatably connected to the supply body 33. A drive bar 44b of the actuator 44 is rotatably connected to the arm body 42 via a connection part 42a. The actuator 44 constitutes a drive unit 50 in cooperation with the link mechanism 45.

The link mechanism 45 moves the remover bar 43 along a predetermined trajectory. The link mechanism 45 is a so-called four-bar link. The link mechanism 45 includes a first link 46, a second link 47, the arm body 42, and the cover 41. One ends of the first link 46 and the second link 47 are connected to the arm body 42 as drive joints 46b and 47b. Positions of the drive joints 46b and 47b are relatively movable with respect to the supply body 33. The other ends of the first link 46 and the second link 47 are connected to the cover 41 as fixed joints 46a and 47a. Positions of the fixed joints 46a and 47a are not movable relative to the supply body 33. That is, the first link 46 rotates such that the drive joint 46b follows an arc-shaped trajectory around the fixed joint 46a as a central axis. Similarly, the second link 47 rotates around the fixed joint 47a as a central axis such that the drive joint 47b follows an arc-shaped trajectory.

According to such a configuration, when the drive bar 44b of the actuator 44 extends and contracts, the arm body 42 to which the tip of the drive bar 44b is connected is driven. The drive joints 46b and 47b of the first link 46 and the second link 47 are connected to the arm body 42. Therefore, the arm body 42 that connects the drive joints 46b and 47b of the first link 46 and the second link 47 is a drive link. A movement trajectory of the arm body 42 is defined by a movement of the other ends of the first link 46 and the second link 47 rotating with respect to the cover 41.

Operations of the film peeling mechanism 40 will be described with reference to FIG. 4, FIG. 5, FIG. 6, and FIG. 7.

FIG. 4 shows the film peeling mechanism 40 in a first mode. The first mode is a state in which the remover bar 43 is not in contact with the film 200. Therefore, the first mode is a state in which a peeling operation for the film 200 is not performed. For example, the first mode is adopted when the semiconductor die 102 is held by the bonding mechanism 20.

In the first mode, the remover bar 43 is disposed between the supply reel 34 and the bonding mechanism 20. The remover bar 43 is disposed above the bonding surface 21S. More specifically, the remover bar 43 is disposed above an imaginary line L1 connecting the supply pin 35B and the bonding surface 21S. This mode is obtained by the actuator 44 contracting the drive bar 44b.

Figure 5:
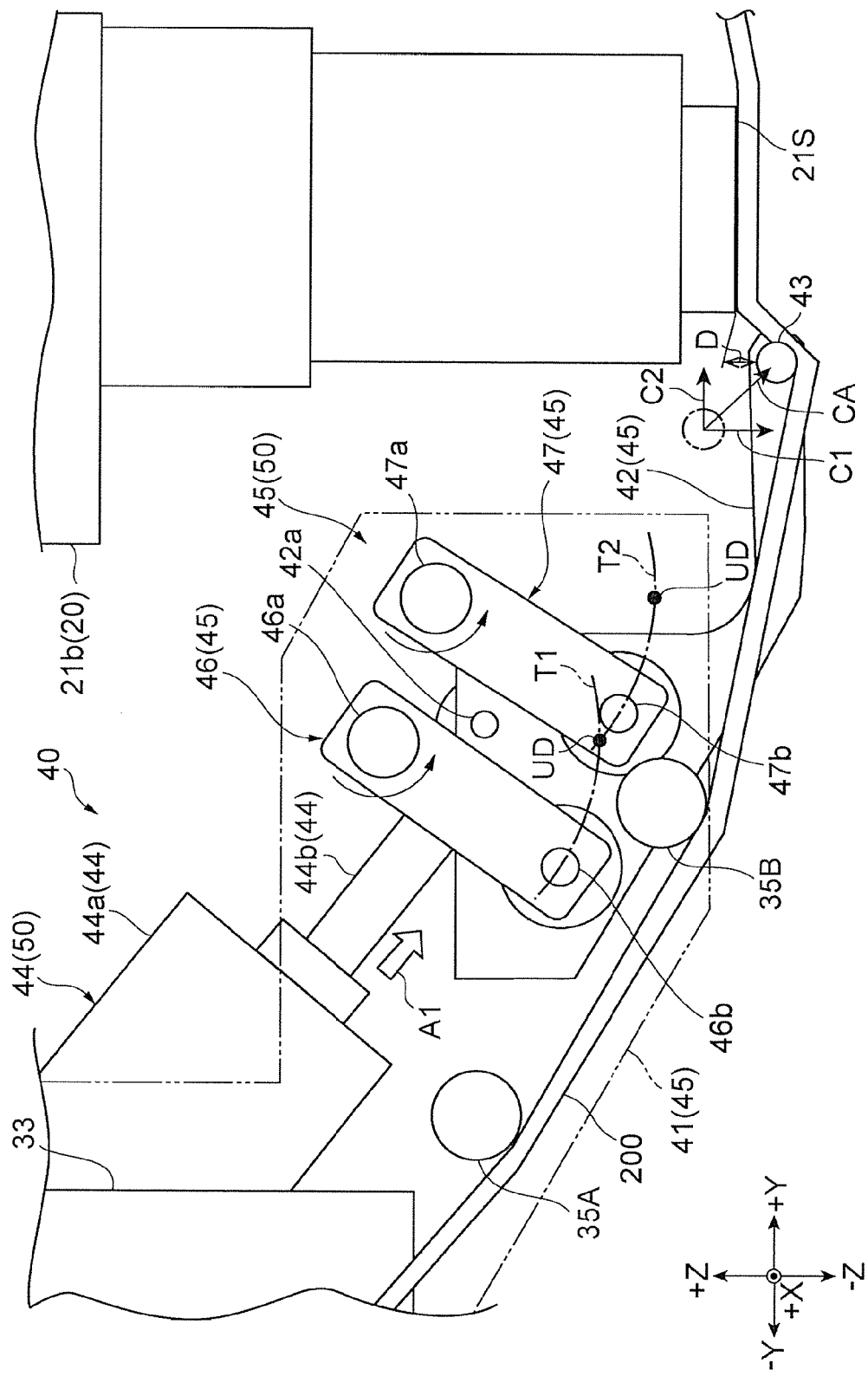
FIG. 5 is a front view showing the film peeling mechanism immediately after a transition from a first mode to a second mode has been completed.

FIG. 5 shows the film peeling mechanism 40 immediately after a transition from the first mode to a second mode has been completed. The second mode is a state in which an operation of peeling the film 200 from the bonding surface 21S is being performed. That is, the state immediately after the transition from the first mode to the second mode shown in FIG. 5 has been completed is a state immediately before the operation of peeling off the film 200 starts.

When the mode is switched from the first mode to the second mode, first, the remover bar 43 is moved from a position above the bonding surface 21S to a position below the bonding surface 21S. This movement continues until the remover bar 43 contacts the film 200. This movement is sufficient if it includes a vertical movement component C1. Therefore, this movement may be a composite CA of the vertical movement component C1 and a lateral movement component C2. A lateral direction is a direction approaching the bonding mechanism 20. Therefore, a configuration in which the remover bar 43 is moved obliquely downward may be employed.

Immediately after the remover bar 43 contacts the film 200, the position of the remover bar 43 is still above the bonding surface 21S. Therefore, the remover bar 43 is further moved below the bonding surface 21S while the remover bar 43 pushes down the film 200. The remover bar 43 is moved until at least the highest position on an outer circumferential surface of the remover bar 43 is located below the bonding surface 21S. In other words, the remover bar 43 is moved to the extent that a gap D is formed between the highest position on the outer circumferential surface of the remover bar 43 and the bonding surface 21S.

Such movement of the remover bar 43 is implemented by the actuator 44 in cooperation with the link mechanism 45. Specifically, the actuator 44 extends a protruding length of the drive bar 44b. Then, the arm body 42 protrudes and is pressed in a direction A1. At this time, a torque corresponding to a distance between the connection part 42a of the drive bar 44b in the arm body 42 and the fixed joints 46a and 47a of the first link 46 and the second link 47 is generated. This torque causes the drive joints 46b and 47b of the first link 46 and the second link 47 to rotate counterclockwise about the fixed joints 46a and 47a as centers of rotation, respectively. A movement trajectory of the arm body 42 is regulated by the movement of each one end of the first link 46 and the second link 47. When each one end of the first link 46 and the second link 47 rotates counterclockwise, each one end moves downward. Furthermore, each one end approaches the bonding mechanism 20. Accordingly, the arm body 42 also moves downward in accordance with the movement of each one end. Further, each one end in the arm body 42 moves to approach the bonding mechanism 20. As a result, the remover bar 43 fixed to the tip of the arm body 42 moves downward as shown by the movement component C1. Further, the remover bar 43 moves closer to the bonding mechanism 20 as shown by the movement component C2. Immediately after the transition to the second mode has been completed, positions of the first link 46 and the second link 47 are in front of a bottom dead center UD.

Figure 6:
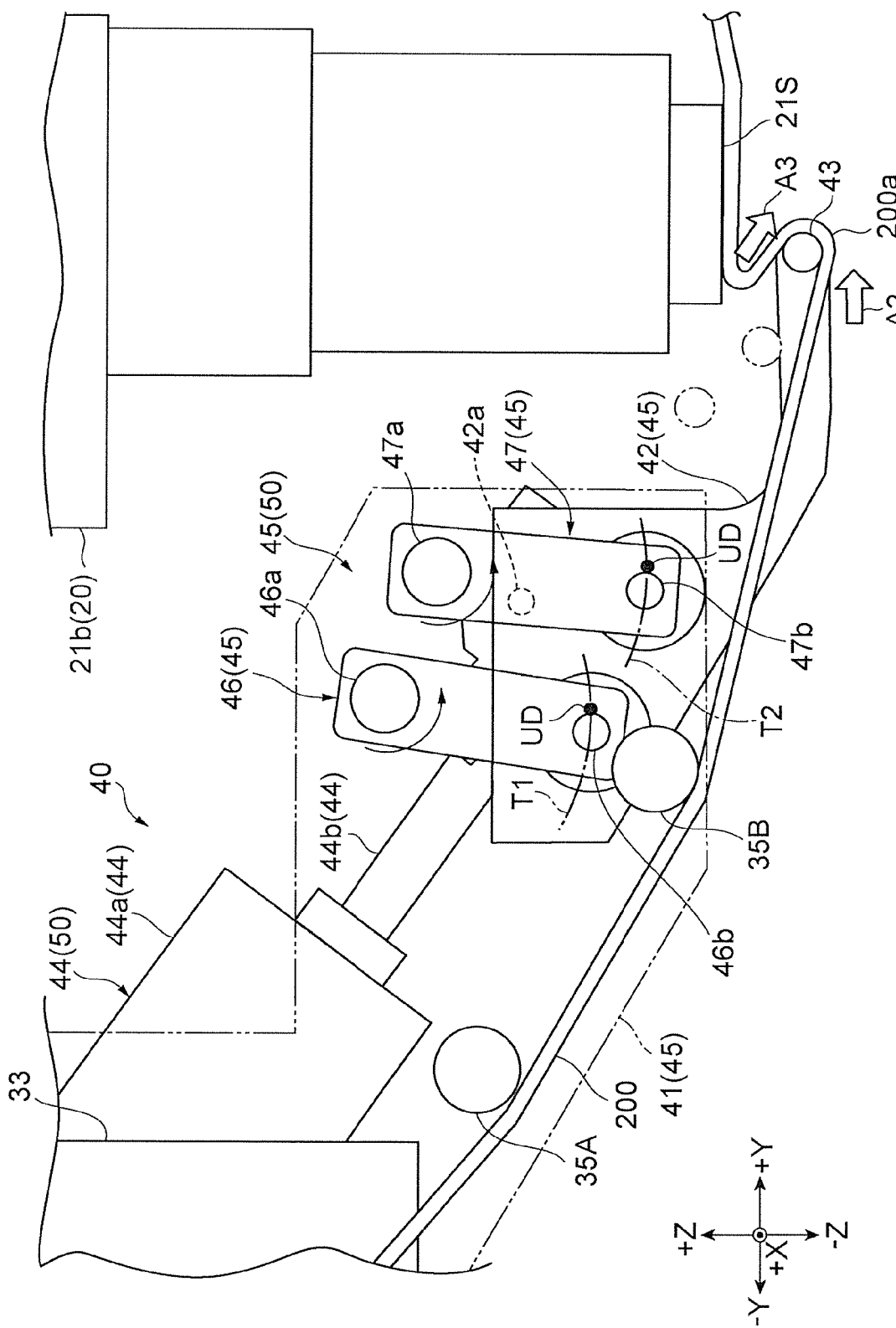
FIG. 6 is a front view showing the film peeling mechanism according to the second mode.
Figure 7:
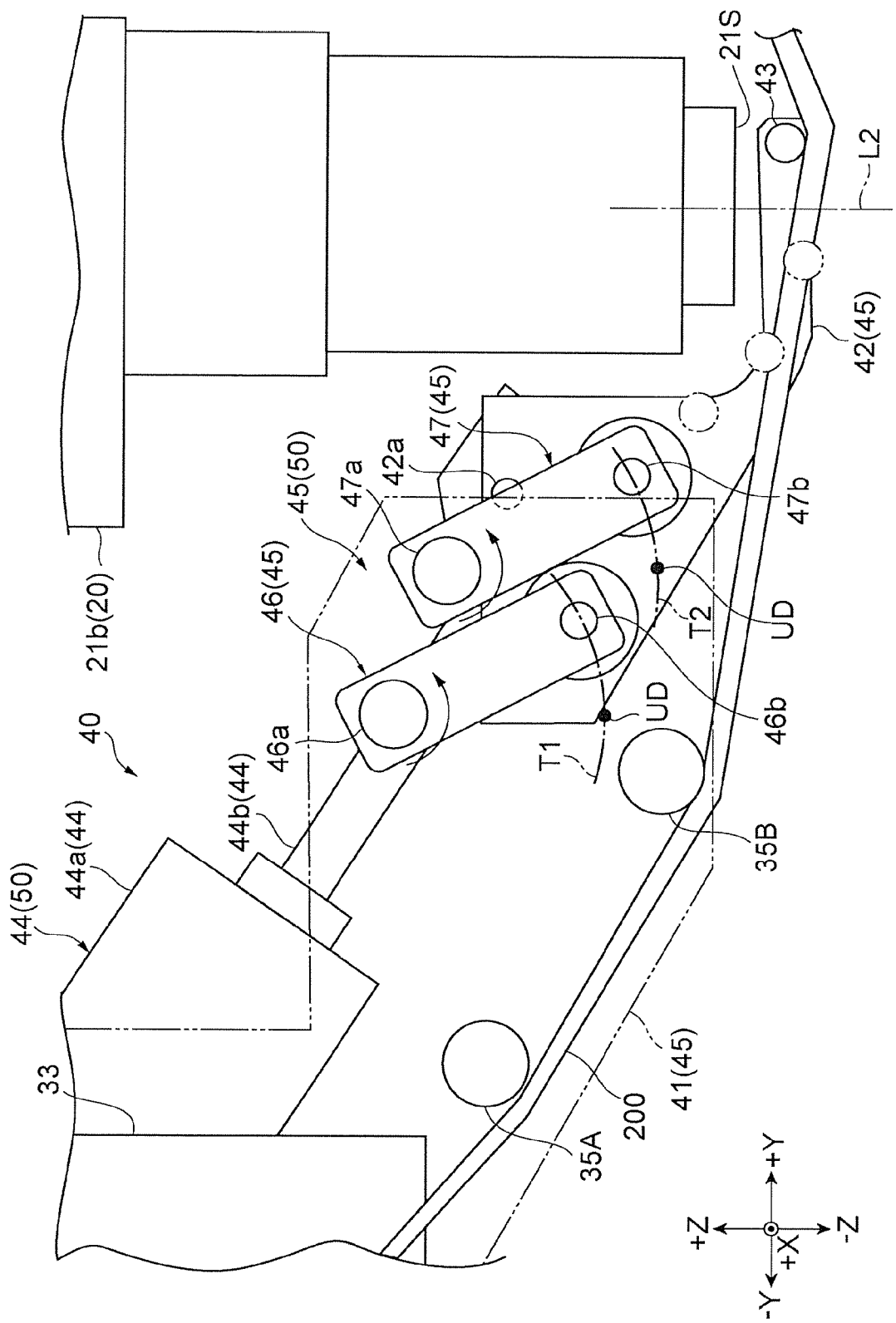
FIG. 7 is a front view showing the film peeling mechanism immediately after the film has been peeled off.

FIG. 6 shows the film peeling mechanism 40 when the second mode is in progress. FIG. 7 shows the film peeling mechanism 40 when the film is completely peeled off from the bonding surface 21S. The expression "in progress of the second mode" indicates a period during which the remover bar 43 moves in a direction in which the film 200 extends, thereby peeling off the film 200 from the bonding surface 21S. The direction in which the film 200 extends indicates a direction along a left to right direction. However, the direction does not need to strictly correspond to the left to right direction.

The remover bar 43 moves in a rightward direction A2 with at least the gap D secured between the remover bar 43 and the bonding surface 21S. As a result, a part 200a of the film 200 is hooked on the remover bar 43. In this state, when the remover bar 43 is further moved in the rightward direction A2, the film 200 is peeled off from the bonding surface 21S in an obliquely downward direction A3. In a state in which the film 200 is peeled off, there may be a case in which there is a part of the film 200 adhered to the bonding surface 21S and a part of the film 200 immediately after being peeled off from the bonding surface 21S between the remover bar 43 and the bonding surface 21S.

Such movement of the remover bar 43 is realized by the actuator 44 in cooperation with the link mechanism 45. Specifically, the actuator 44 further increases the protruding length of the drive bar 44b. Immediately after the transition to the second mode is completed, the positions of the first link 46 and the second link 47 are just in front of the bottom dead center UD as shown by trajectories T1 and T2 in FIG. 5. In the second mode, the first link 46 and the second link 47 further rotate counterclockwise. As a result, one ends of the first link 46 and the second link 47 pass through the bottom dead center UD as shown by the trajectories T1 and T2 in FIG. 7. In the movement near the bottom dead center UD, an amount of movement of the drive joints 46b and 47b of the first link 46 and the second link 47 in the vertical direction is small. Therefore, the movement of the drive joints 46b and 47b of the first link 46 and the second link 47 can be regarded as a rightward movement. Therefore, the remover bar 43 can be moved substantially in the direction in which the film 200 extends. Here, the extending direction of the film 200 is a direction along the bonding surface 21S.

As shown in FIG. 7, when the remover bar 43 is located rightward (on the collection reel 37 side) from a center line L2 of the bonding surface 21S, the film 200 may be completely peeled off from the bonding surface 21S.

A final arrival position of the remover bar 43 may be a predetermined position. The arrival position may be a position when the entire film 200 is peeled off from the bonding surface 21S. The final arrival position in the present disclosure is the position when the entire film 200 is peeled off from the bonding surface 21S. In this case, a configuration in which it is detected that the entire film 200 is peeled off from the bonding surface 21S is required. Hereinafter, an example of a configuration for detecting peeling of the film 200 will be described.

The detection of the peeling of the film 200 is performed by the control unit 8 controlling the supply reel 34 and the collection reel 37. First, in the first mode, the control unit 8 rotates the supply reel 34 in an unwinding direction. This rotation causes a slack in the film 200 between the supply reel 34 and the bonding mechanism 20. Next, in the first mode, the control unit 8 rotates the collection reel 37 in the winding direction. Here, when the film 200 is not stuck to the bonding surface 21S, the collection reel 37 winds up the film 200 by the slack of the film 200. Therefore, no load torque is generated on the collection reel 37 during winding the slack, and a load torque is generated after winding the slack. When such a change in torque is detected, it is understood that the film 200 is not stuck to the bonding surface 21S.

On the other hand, when the film 200 is stuck to the bonding surface 21S, the slack is not wound even if the collection reel 37 is rotated. Therefore, immediately after the rotation of the collection reel 37, a load torque is generated. When such a torque is detected, it is understood that the film 200 is stuck to the bonding surface 21S.

In addition, the state in which the load torque is generated on the collection reel 37 is a state in which tension is generated in the film 200 between the bonding surface 21S and the collection reel 37. In such a state, the peeling operation described above is performed. Then, the moment the entire film 200 is peeled off from the bonding surface 21S, the tension is released. As a result, the collection reel 37 slightly rotates in the winding direction. Therefore, when this rotation is detected, it can be considered that the film 200 has been peeled off from the bonding surface 21S.

Further, the film 200 that has been released from tension may have a slack. Therefore, the collection reel 37 is further slightly rotated in the winding direction. Then, no load torque is generated on the collection reel 37 during winding the slack. On the other hand, after winding the slack, a load torque is generated. By detecting such a change in torque, it is possible to reliably detect that the film 200 has been peeled off.

<Bonding Method>

Figure 8:
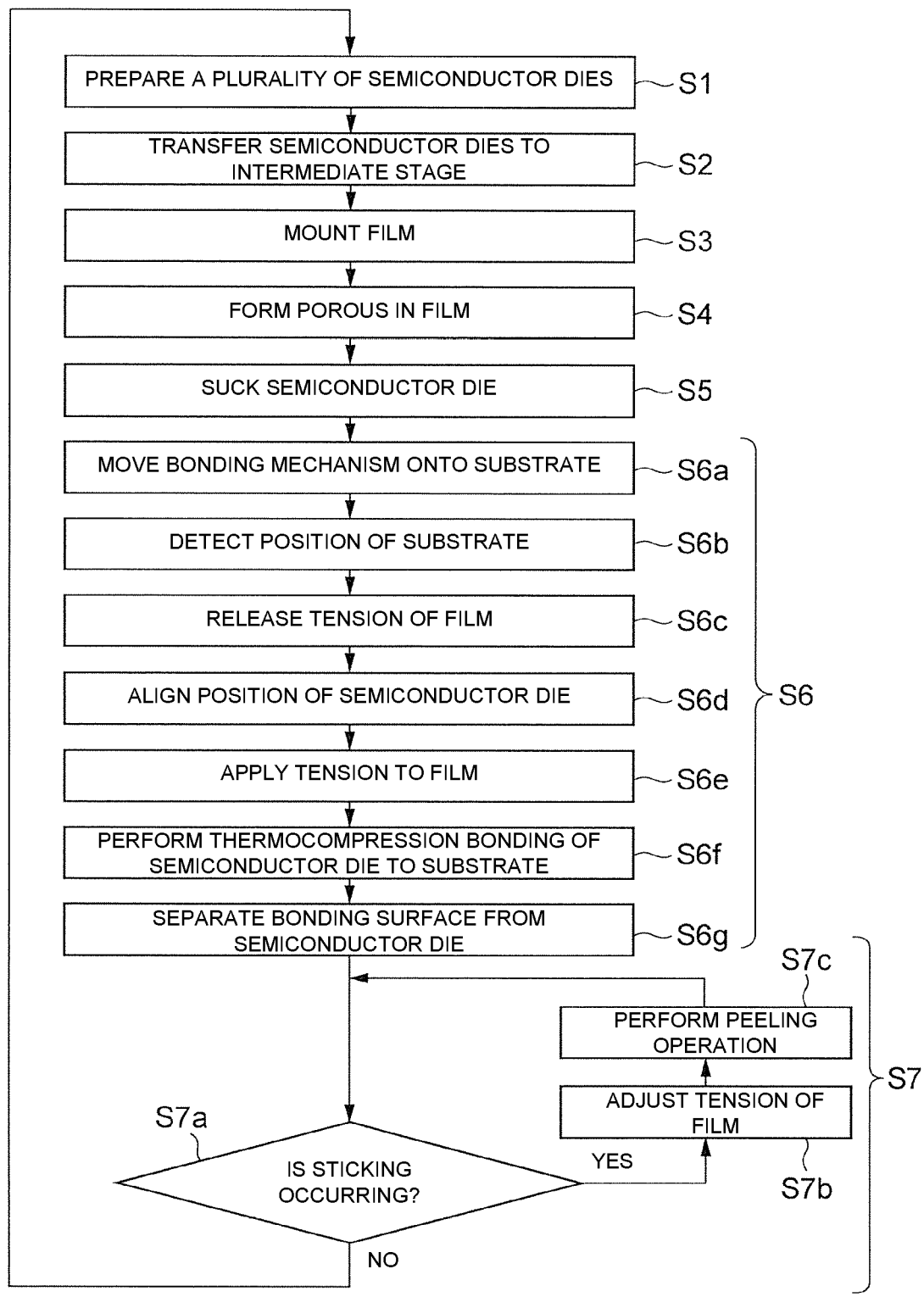
FIG. 8 is a flowchart showing main steps of a bonding method.

Next, a bonding method using the bonding apparatus 1 will be described with reference to FIG. 8. The bonding method according to the present disclosure is performed using the bonding apparatus 1 shown in FIG. 1. The semiconductor device 100 (see FIG. 2) is manufactured by the bonding method of the present disclosure.

First, a plurality of diced semiconductor dies 102 are prepared on the wafer stage 2 (S1). Specifically, the wafer 110 is prepared on the wafer stage 2. The wafer 110 includes the plurality of semiconductor dies 102 adhered to a film. The wafer 110 is disposed on the wafer stage 2. At this time, the first main surfaces 102a of the plurality of semiconductor dies 102 face upward. Further, the second main surfaces 102b face the wafer stage 2.

Next, the semiconductor dies 102 are transferred to the intermediate stage 3 (S2). For example, the plurality of semiconductor dies 102 on the wafer stage 2 are transferred to the intermediate stage 3 one by one. This transfer is performed by a suction tool in cooperation with a pickup unit.

Next, the film 200 is mounted on the bonding surface 21S (S3). Then, suction pores are formed in the mounted film 200 (S4).

Next, the semiconductor die 102 is sucked (S5). First, the control unit 8 controls the XY stage 7 to move the bonding mechanism 20 onto the intermediate stage 3. Subsequently, the control unit 8 controls the Z axis drive mechanism 13 to move the bonding mechanism 20 in the negative Z axis direction. The control unit 8 stops moving when the second main surface 102b of the semiconductor die 102 comes into contact with the film 200 on the bonding surface 21S. Next, the control unit 8 controls the pneumatic system to start suction using the suction holes. Due to this suction, the semiconductor die 102 is sucked by the bonding mechanism 20. Then, the control unit 8 controls the Z axis drive mechanism 13 to move the bonding mechanism 20 in the positive Z axis direction.

Next, the semiconductor die 102 is thermocompression-bonded to the substrate 101 via the adhesive member 103 using the bonding mechanism 20 (S6).

Specifically, first, the control unit 8 controls the XY stage 7 to move the bonding mechanism 20 onto the substrate 101 (S6a). As a result, the bonding mechanism 20 that has sucked the semiconductor die 102 moves onto the bonding stage 4. The substrate 101 is disposed on the bonding stage 4. The adhesive member 103 is disposed on a region of the substrate 101 on which the semiconductor die 102 is mounted. The adhesive member 103 is in the form of a paste at room temperature.

Next, the control unit 8 detects the position of the substrate 101 using the imaging unit 14 or the like (S6b). Next, the control unit 8 controls the supply reel 34 and/or the collection reel 37 to release tension in the film 200 (S6c). Next, the control unit 8 performs final alignment between the semiconductor die 102 and the substrate 101 (S6d). At this time, the semiconductor die 102 is held by the bonding mechanism 20 via the film 200. Then, in step S6c, since the tension in the film 200 is relaxed, the semiconductor die 102 can be moved with the movement of the bonding mechanism 20. Specifically, in order to adjust the position of the semiconductor die 102 around the Z axis with respect to the substrate 101, the control unit 8 slightly rotates the bonding mechanism 20 around the Z axis. In this case, the semiconductor die 102 also rotates around the Z axis with the movement of the bonding mechanism 20 because the tension in the film 200 is relaxed.

Next, the control unit 8 controls the supply reel 34 and/or the collection reel 37 to apply tension to the film 200 (S6e).

Next, the control unit 8 performs thermocompression bonding of the semiconductor die 102 to the substrate 101 (S6f). The control unit 8 transmits a control signal to the Z axis drive mechanism 13. As a result, the bonding mechanism 20 is lowered toward the bonding stage 4. This lowering operation is continued until the bump electrodes 106 contacts the first main surface 101a of the substrate 101. When the contact of the bump electrodes 106 with the substrate 101 is detected, the control unit 8 stops the lowering operation. Further, the control unit 8 transmits a control signal to the heater 22 (heat source). As a result, the heater 22 starts heating. This heating operation may be started while the lowering operation is performed, or may be started after the lowering operation is completed. According to the lowering operation and the heating operation, heat is transmitted from the bonding surface 21S to the adhesive member 103 via the semiconductor die 102 that has contacted the adhesive member 103 due to the lowering operation. This heat cures the adhesive member 103.

An adhesive material may have a film-like shape at room temperature. This film-shaped adhesive material is softened by receiving heat. Therefore, the control unit 8 performs the lowering operation and the heating operation in parallel, thereby pressing the semiconductor die 102 downward while softening the film-shaped adhesive material, and bringing the bump electrodes 106 into contact with the substrate 101. Then, the control unit 8 stops the heating operation. As a result, a temperature of the film-shaped adhesive material rises. As a result, the adhesive material is cured. By this curing, the semiconductor die 102 is fixed to the substrate 101.

By the above operations, the bump electrodes 106 of the semiconductor die 102 and a wiring of the substrate 101 are electrically connected to each other. At the same time, a space between the semiconductor die 102 and the substrate 101 is encapsulated with resin. Also, the adhesive member 103 is not limited to an aspect in which it is provided on the substrate 101 in advance before bonding. The adhesive member 103 may be filled as an underfill between the semiconductor die 102 and the substrate 101 during the bonding process.

After the thermocompression bonding of the semiconductor die 102 to the substrate 101 is completed, the semiconductor die 102 is separated from the bonding surface 21S (S6g). The control unit 8 causes the suction operation of the suction holes to be in an off state. Thereafter, the control unit 8 controls the Z axis drive mechanism 13 to move the bonding mechanism 20 in the positive Z axis direction. According to these operations, only the semiconductor die 102 can be separated from the bonding surface 21S while the film 200 is restrained.

A step (S7) of peeling the film 200 from the bonding mechanism 20 is performed. First, the control unit 8 checks whether or not the film 200 is stuck to the bonding surface 21S (S7a). When the film 200 sticks to the bonding surface 21S, the film 200 may stick to the entire bonding surface 21S, and the film 200 may stick to a part of the bonding surface 21S. This checking is performed by the control unit 8 controlling the supply reel 34 and the collection reel 37 as described above. Next, when the sticking is not detected, the process is performed again sequentially from the step S1. On the other hand, when sticking is detected, the peeling operation is performed. First, in order to detect that the film 200 has been peeled off using the peeling operation, the control unit 8 controls the supply reel 34 and the collection reel 37 to loosen the film 200 on the supply reel 34 side and apply tension to the film 200 on the collection reel 37 side (S7b: a first operation). Then, the control unit 8 controls the actuator 44 to perform the peeling operation (S7c: a second operation). Then, after the peeling operation has been completed, it is checked again whether or not the film 200 is stuck to the bonding surface 21S (S7a). Then, when the sticking is not detected, the steps are performed again from the step S1. When sticking is detected, the step S7b is performed again.

Next, effects of the bonding apparatus 1 and the bonding method will be described.

In the bonding method and the bonding apparatus 1, the bonding mechanism 20 holds the semiconductor die 102 via the film 200 supplied to the bonding surface 21S. Then, the bonding mechanism 20 provides heat from the heater 22 to the bonding surface 21S, and performs thermocompression bonding of the held semiconductor die 102 to the substrate 101 via the adhesive material. The bonding surface 21S is covered with the film 200 even if the adhesive material creeps up. Therefore, it becomes possible to protect the bonding surface 21S from the adhesive material that creeps up. Furthermore, when heat for thermocompression bonding is provided, the heat is transmitted to the semiconductor die 102 via the bonding surface 21S and the film 200. As a result, the heat may cause the film 200 to stick to the bonding surface 21S. Therefore, the bonding apparatus 1 causes the remover bar 43 to enter between the film 200 and the bonding surface 21S. By this operation, the film 200 stuck to the bonding surface 21S is peeled off. Therefore, the bonding apparatus 1 can protect the bonding surface 21S from the adhesive material and can eliminate sticking of the film 200 to the bonding surface 21S. Therefore, the bonding apparatus 1 that uses the film 200 to prevent the creeping up can inhibit a decrease in productivity.

Incidentally, as a configuration for eliminating sticking of the film 200 to the bonding surface 21S, the relative positions of the bonding mechanism 20 and the film conveyance mechanism 30 in the vertical direction may be changed. For example, the entire film conveyance mechanism 30 may be lowered downward while the position of the bonding mechanism 20 is maintained. However, such a configuration requires a configuration for moving the bonding mechanism 20 and the film conveyance mechanism 30. Further, in the case of the movable configuration, since the rigidity tends to decrease, it may affect bonding accuracy.

On the other hand, the bonding apparatus 1 eliminates sticking of the film 200 using the remover bar 43 without moving the bonding mechanism 20 and the film conveyance mechanism 30. Therefore, the configuration for moving the bonding mechanism 20 and the film conveyance mechanism 30 is unnecessary. As a result, the bonding apparatus 1 can secure desired rigidity.

A driving force is supplied to the film peeling mechanism 40 from one actuator 44. Further, the film peeling mechanism 40 realizes the trajectory of the remover bar 43 using the link mechanism 45. Accordingly, it is possible to simplify a configuration of a drive mechanism by reducing the number of drive shafts. As a result, the film peeling mechanism 40 can realize complicated trajectory control with a simple configuration.

The film conveyance mechanism 30 has the supply reel 34 and the collection reel 37 that are disposed above the bonding surface 21S with the bonding mechanism 20 interposed therebetween. The film 200 supplied from the supply reel 34 is wound around the collection reel 37 via the bonding surface 21S. The film peeling mechanism 40 has the actuator 44 for driving the remover bar 43 and the link mechanism 45. The drive unit 50 switches the remover bar 43 between the first mode in which the remover bar 43 is disposed between the supply reel 34 and the bonding mechanism 20 and above the bonding surface 21S and the second mode in which the remover bar 43 is moved below the bonding surface 21S in the extending direction of the film 200 while being in contact with the film 200. According to this configuration, the remover bar 43 is moved below the bonding surface 21S in the extending direction of the film 200. As a result, the film 200 stuck to the bonding surface 21S can be peeled off while being pulled obliquely downward. Therefore, the film 200 can be reliably peeled off from the bonding surface 21S.

When the mode is switched from the first mode to the second mode, the drive unit 50 moves the remover bar 43 from above the bonding surface 21S to below the bonding surface 21S until the remover bar 43 contacts the film 200. Next, after the remover bar 43 is brought into contact with the film 200, the remover bar 43 is moved further below the bonding surface 21S while pressing down the film 200. According to this operation, the remover bar 43 can be reliably moved below the bonding surface 21S. As a result, the peeling operation can be performed with the gap D secured between the remover bar 43 and the bonding surface 21S.

The bonding apparatus 1 further includes the control unit 8 that controls operations of the supply reel 34, the collection reel 37, and the drive unit 50. When the mode is the first mode, the control unit 8 controls the supply reel 34 such that tension is not generated in a portion of the film 200 stretched from the supply reel 34 to the bonding surface 21S. The control unit 8 performs the first operation of controlling the collection reel 37 such that tension is generated in a portion of the film 200 stretched from the bonding surface 21S to the collection reel 37. After the first operation, the control unit 8 performs the second operation of controlling the drive unit 50 to be switched from the first mode to the second mode. According to this configuration, a slack is generated in the film 200 using the supply reel 34. Then, if the slack can be recovered when the collection reel 37 is driven, it indicates that there is no part of the film 200 stuck to another member between the supply reel 34 and the collection reel 37. Therefore, the presence or absence of sticking of the film 200 to the bonding surface 21S can be detected. Further, the peeling operation is performed, and the slack is recovered by the collection reel 37 at the moment when the film 200 is peeled off from the bonding surface 21S. Therefore, it can be reliably detected that the film 200 has been peeled off from the bonding surface 21S.

The bonding apparatus 1 further includes the bonding head 11 to which the bonding mechanism 20 and the film conveyance mechanism 30 are attached and which is rotatable around the normal direction of the bonding surface. According to this configuration, a posture of the semiconductor die 102 held by the bonding mechanism 20 can be corrected with respect to the substrate 101.

As described above, the bonding apparatus and the bonding method of the present disclosure have been described in detail based on the embodiments. However, the bonding apparatus and the bonding method of the present disclosure are not limited to the above embodiment. Various modifications can be made to the bonding apparatus and the bonding method of the present disclosure without departing from the gist thereof.

In the above embodiment, the air permeability is ensured by performing a perforation process on the film having no air holes. For example, the film may be air permeable from the beginning. For example, a film formed of a porous sheet and a nonwoven fabric may be used. In this case, the step of forming pores in the film (S4) is unnecessary in the bonding method. In addition, the bonding apparatus does not require a mechanism for forming pores in the film. Therefore, the configuration of the bonding apparatus can be simplified, and the number of steps of the bonding method can be reduced.

In the above disclosure, the air cylinder is exemplified as the drive source of the film peeling mechanism 40, but the drive source is not limited thereto. For example, a motor that generates rotational torque may be used as the drive source.

The invention claimed is:

1. A bonding apparatus that mounts an electronic component on a substrate or another electronic component, comprising:
   a bonding unit, includes:
      a bonding surface, detachably holding the electronic component via a film, and
      a heat source, supplying heat to the bonding surface;
   a film supply unit which supplies the film along the bonding surface;
   a peeling member which is capable of entering between the film and the bonding surface; and
   a drive unit which moves the peeling member between the film and the bonding surface to separate the film from the bonding surface;
   wherein the film supply unit includes a pair of reels which sandwich the bonding unit and apply tension to the film,
   the film supplied from one of the reels is wound on the other reel via the bonding surface, and
   the drive unit switches the peeling member between a first mode and a second mode,
   in the first mode, the peeling member is disposed between the one reel and the bonding unit or between the other reel and the bonding unit and is disposed above the bonding surface,
   in the second mode, the peeling member is moved below the bonding surface in an extending direction of the film while in contact with the film.

2. The bonding apparatus according to claim 1, wherein when the peeling member is switched from the first mode to the second mode, the drive unit moves the peeling member from above the bonding surface to below the bonding surface until the peeling member contacts the film to contact the peeling member with the film, and then moves the peeling member further below the bonding surface with the film pressed down.

3. The bonding apparatus according to claim 2, further comprising:
   a control unit which controls operations of the pair of reels and the drive unit,
   wherein the control unit performs:
      a first operation of, in the first mode, controlling one of the reels such that tension is not generated in a portion of the film stretched from the one reel to the bonding surface, and controlling the other reel such that tension is generated in a portion of the film stretched from the bonding surface to the other reel, and
      a second operation of, after the first operation, controlling the drive unit to switch from the first mode to the second mode.

4. The bonding apparatus according to claim 1, further comprising:
   a base to which the bonding unit and the film supply unit are attached, and which is rotatable around a normal direction of the bonding surface.

5. A bonding method for mounting an electronic component on a substrate or another electronic component, comprising steps of:
   supplying a film from a film supply unit to a bonding surface of a bonding unit that detachably holds the electronic component, and then holding the electronic component on the bonding surface via the film;
   mounting the electronic component held on the bonding surface to the substrate or another electronic component; and
   operating a drive unit which drives a peeling member that is capable of entering between the film and the bonding surface to cause the peeling member to enter between the film and the bonding surface, thereby separating the film from the bonding surface.

6. The bonding apparatus according to claim 2, further comprising:
   a base to which the bonding unit and the film supply unit are attached, and which is rotatable around a normal direction of the bonding surface.

7. The bonding apparatus according to claim 3, further comprising:
   a base to which the bonding unit and the film supply unit are attached, and which is rotatable around a normal direction of the bonding surface.

* * * * *